United States Patent [19]

Akselrad

[11] 4,289,797
[45] Sep. 15, 1981

[54] METHOD OF DEPOSITING UNIFORM FILMS OF $SI_xN_y$ OR $SI_xO_y$ IN A PLASMA REACTOR

[75] Inventor: Aline Akselrad, Princeton, N.J.

[73] Assignee: Western Electric Co., Incorporated, New York, N.Y.

[21] Appl. No.: 83,902

[22] Filed: Oct. 11, 1979

[51] Int. Cl.$^3$ .............................................. C23C 11/00
[52] U.S. Cl. ..................................... 427/39; 118/50.1; 204/164
[58] Field of Search ............................ 427/38, 39, 40; 204/164; 118/723, 50.1

[56] References Cited

U.S. PATENT DOCUMENTS

| | | | |
|---|---|---|---|
| 3,287,243 | 11/1966 | Ligenza | 204/192 |
| 3,485,666 | 12/1969 | Sterling et al. | 427/39 |
| 3,600,218 | 8/1971 | Pennebaker | 427/39 |
| 3,757,733 | 9/1973 | Reinberg | 204/192 |
| 3,983,264 | 9/1976 | Schroen et al. | 427/39 |
| 4,028,142 | 6/1977 | Bitzer et al. | 148/16.5 |
| 4,058,430 | 11/1977 | Suntola et al. | 156/611 |
| 4,066,037 | 1/1978 | Jacob | 118/723 |
| 4,089,992 | 5/1978 | Doo et al. | 427/94 |

OTHER PUBLICATIONS

Rosler et al., "Solid State Technology", Jun. 1976, pp. 45-50.
Taft, "J. Electrochem. Soc.: Solid State Science", vol. 118, No. 8, Aug. 1971, pp. 1341-1346.
Brodsky, "IBM TDB", vol. 19, No. 11, Apr. 1977, pp. 4447-4450.

*Primary Examiner*—John H. Newsome
*Attorney, Agent, or Firm*—J. F. Spivak

[57] ABSTRACT

A method of depositing a uniform dielectric film on a silicon substrate comprising flowing a plasma comprising an RF-excited mixture of an inert gas such as argon and silane over the substrate to form a film of porous a-$Si_xH_y$ over the surface of the substrate. The flow of plasma is then discontinued and a flow of a nitrogen or oxygen plasma is substituted therefor. The temperature of the substrate is increased to at least 360° C. to diffuse-out hydrogen from the $Si_xH_y$ film on the substrate, each departing hydrogen atom leaving a dangling Si bond behind which combines with the activated oxygen or nitrogen thereby to form the desired dielectric film of formula $Si_xN_y$ or $Si_xO_y$.

6 Claims, No Drawings

METHOD OF DEPOSITING UNIFORM FILMS OF $SI_xN_y$ OR $SI_xO_y$ IN A PLASMA REACTOR

TECHNICAL FIELD

Broadly speaking, this invention relates to plasma deposition. More particularly, in a preferred embodiment, this invention relates to a method of depositing a two-component film of material from successive, one-component gas plasmas.

BACKGROUND OF THE INVENTION

Plasma deposition is a technique that is widely used in industry to deposit thin films of material on a variety of workpieces. For example, in the manufacture of integrated circuits, an RF-excited plasma comprising an inert gas, such as argon, and the reactive species silane, ($SiH_4$,) and ammonia, ($NH_3$), is used to deposit a thin film of SiN, the designation given to compositions approaching $Si_3N_4$ but not necessarily identical with $Si_3N_4$, on a silicon wafer approximately 3 inches in diameter. The SiN film can then be used as mechanical protection during subsequent processing of the wafer, as a dielectric insulating layer between 2 layers of metallization, or (if improved) as a hermetic seal.

It will be appreciated that among the desirable properties that must be possessed by such a silicon nitride film are uniformity of thickness, uniformity of composition and freedom from defects such as impurities and pin-holes. Unfortunately, the prior art plasma deposition processes are unpredictable and such undesirable defects are quite common, occurring randomly, for no apparent reason.

One mechanism that has been proposed to explain at least some of the observed defects is a reaction of the form:

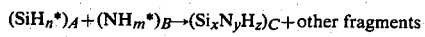

where $n \leq 4$ and $m \leq 3$, where * indicates some metastable excited configuration and where the component $Si_xN_yH_z$ can be in an excited state or in a ground state, the said reaction taking place in the plasma rather than on the surface of the substrate.

As might be expected, such a reaction would produce particulate matter that would deposit onto the surface of the substrate. One reason that has been suggested for the occurrence of this reaction is that, once a molecule of $Si_xN_yH_z$ has formed in the plama, it provides all of the incentives for plasma deposition that the substrate itself provides.

SUMMARY OF THE INVENTION

As a solution to this problem, I propose a method wherein a thin, uniform film of porous a-$Si_xH_y$ is deposited on a silicon substrate by means of a one-component plasma comprising a silicon-containing active radical, such as silane or silicon tetrachloride. After the porous film has been deposited, this one-component plasma is withdrawn and the film oxidized or nitrided in situ by flowing activated oxygen or nitrogen over the substrate.

The invention and its mode of operation will be more fully understood from the following detailed description.

DETAILED DESCRIPTION

The instant invention provides for the plasma deposition of denser, and more uniform films of $Si_xN_y$, $Si_xN_yO_z$ or $Si_xO_y$ in a two-step process utilizing successive one-component plasmas.

As an example, consider the deposition of $Si_xN_y$. First, using an entirely conventional Reinberg-type plasma reaction chamber, or equivalent, a thin, uniform film of $Si_xH_y$ is deposited on a silicon substrate using an RF-excited $SiH_y$+Ar gas plasma. The Reinberg reaction chamber is described in U.S. Pat. No. 3,757,733 which issued on Sept. 11, 1973 to A. R. Reinberg, which patent is hereby incorporated by reference as if more fully set forth herein. The ratio of y/x in the deposited $Si_xH_y$ film is adjusted by controlling the temperature of the substrate, which will typically fall between 50° C. and 300° C.

The $Si_xH_y$ film that is deposited is actually a porous, amorphous a-$Si_xH_y$ film with its porosity and total hydrogen content being primarily determined by deposition temperature, deposition rate and the RF power which is applied to the reaction chamber. The properties of thin films of a $Si_xH_y$ are described in "Infrared and Raman Spectra of the Silicon-Hydrogen Bonds in Amorphous Silicon Prepared by Glow Discharge and Sputtering" by M. H. Brodsky, M. Cardona and J. J. Cuomo, *Phy. Rev. B.*, Vol. 16, No. 8, 15 October 1977 at Pg. 3556; "Properties of Amorphous Silicon and a-Si Solar Cells" by D. E. Carlson, C. R. Wronski, J. I. Pankove, P. J. Zanzucchi and D. L. Staebler, *RCA REview*, Vol. 38, June 1977, pp. 211–225 (Table I at Pg. 217 in particular); and "Controlling the Type of Bonded Hydrogen Sites in Glow-Discharge Amorphous Silicon Films" by M. H. Brodsky, *IBM Technical Disclosure Bulletin*, Vol. 19, No. 11, April 1977, pp. 4447–4450, all of which references are hereby incorporated by reference as if more fully set forth herein.

After an appropriate time interval, the flow of $SiH_4$+Ar is replaced by a flow of $N_2$, or other suitable nitrogen-containing mixture.

Because the flow of $SiH_4$ has been terminated, its premature decomposition is no longer a problem; thus, the pressure, the frequency of the RF-excitation and/or the input power to the reaction chamber may be increased to a point where activated nitrogen is produced in the chamber. Next, the temperature of the substrate is raised to more than 360° C. so that hydrogen starts to diffuse out of the $Si_xH_y$. Since a-Si is porous, and since the departing hydrogen leaves behind dangling Si bonds, the diffusion of activated N into Si and the formation of Si-N bonds is accelerated, thus forming a uniform, impurity-free, dielectric film of $Si_xN_y$.

If extremely uniform layers of $Si_xN_y$ are required, the process may be modified by laying down a very thin layer of a-$Si_xH_y$ and repeating the procedure several times until the desired overall thickness is obtained. As an alternative, one could start the process by depositing a thin layer of $Si_xN_yH_z$ which is porous and N-deficient and complete the nitridation in a N* rich plasma by adding some nitrogen-containing compound to the initial gas plasma. However, the possibility of non-uniformity remains with this alternate embodiment.

The above-described process has the following advantages:

1. In a simple plasma reactor, the uniformity of a one-component film, such as Si, is more easy to obtain than the uniformity of a film which is deposited from a mixture of two gases which differ in activation energy, for example, SiH$_4$ and N$_2$ or SiH$_4$ and NH$_3$;

2. More complex compositions and layer structures can be attempted sequentially;

3. If the diffusion of the active radical (N*) into Si layer dominates, the film will be denser than ordinary SiN and it is possible that the tensile stress will decrease; and 4. Homogenous nucleation of Si$_x$N$_y$H$_z$ and the resulting particle contamination are eliminated.

One skilled in the art will appreciate that, by substituting a flow of activated oxygen for the flow of activated nitrogen in the above-described process, the film that would ultimately form on the substrate would be Si$_x$O$_y$ rather than Si$_x$N$_y$. Similarly, by flowing simultaneously both nitrogen and oxygen, the film would comprise Si$_x$N$_y$O$_z$. It will also be appreciated that while RF-excitation of the plasma is the preferred embodiment, other forms of excitation are possible. Likewise, while silane is the preferred embodiment for the first plasma, other volatile Si compounds can be used.

One skilled in the art may make various changes to the above-described processes without departing from the spirit and scope of the invention.

What is claimed is:

1. A method of depositing a uniform dielectric film on a silicon substrate, comprising the steps of:

flowing a first plasma comprising an excited mixture of inert gas and a volatile Si compound over said substrate thereby to form a film having porous a-Si$_x$H$_y$ over the surface of said substrate;

discontinuing the flow of said first plasma and substituting therefor a flow of a second excited plasma comprising an activated gas selected from the group consisting of oxygen and nitrogen over said substrate; and then elevating the temperature of said substrate to cause the hydrogen to diffuse-out from said porous a-Si$_x$H$_y$ film, each departing hydrogen atom leaving behind a dangling Si bond which combines with an excited radical of the activated gas in said second plasma thereby to form said dielectric film of formula Si$_x$M$_y$, where M represents either oxygen or nitrogen, depending on the identity of said activated gas.

2. The method according to claim 1, wherein said substrate is physically located within an RF-excited, plasma reaction chamber and the gas which comprises said second excited plasma is activated by increasing the level of the RF power supplied to the reaction chamber over that which was supplied to excite the mixture of the inert gas and the volatile Si compound.

3. The method according to claim 1, wherein said substrate is physically positioned within an RF-excited, plasma reaction chamber and the gas which comprises the second excited plasma is activated by changing the frequency of the RF-excitation to a frequency which is above that used to excite the mixture of the inert gas and the volatile Si compound.

4. The method according to claim 1, wherein said substrate is physically positioned within a plasma reaction chamber and the gas which comprises the second excited plasma is activated by adjusting the pressure of the gas which comprises the second excited plasma to a value to permit activation.

5. The method according to claim 1, wherein said substituting step comprises:

substituting the flow of a second excited plasma comprising a mixture of activated oxygen and nitrogen, whereby the dielectric film formed on said substrate comprises Si$_x$N$_y$O$_z$.

6. The method according to claim 1, wherein said temperature-elevating step comprises raising the temperature of said substrate in excess of 360° C.

* * * * *